US008739085B1

(12) United States Patent
Baumgartner et al.

(10) Patent No.: US 8,739,085 B1
(45) Date of Patent: May 27, 2014

(54) VECTORIZATION OF BIT-LEVEL NETLISTS

(71) Applicant: International Business Machines Corporation, Armonk, NY (US)

(72) Inventors: Jason R. Baumgartner, Austin, TX (US); Steven M. German, Wayland, MD (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/709,748

(22) Filed: Dec. 10, 2012

(51) Int. Cl.
*G06F 9/45* (2006.01)
*G06F 9/455* (2006.01)
*G06F 17/50* (2006.01)

(52) U.S. Cl.
USPC .......................................... 716/103; 716/106

(58) Field of Classification Search
USPC .................................. 716/103, 106
See application file for complete search history.

(56) References Cited

U.S. PATENT DOCUMENTS

| | | | |
|---|---|---|---|
| 5,862,149 A | 1/1999 | Carpenter et al. | |
| 6,237,121 B1 | 5/2001 | Yadavalli et al. | |
| 6,397,373 B1 | 5/2002 | Tseng et al. | |
| 6,728,939 B2 | 4/2004 | Johannsen | |
| 8,001,498 B2 | 8/2011 | Bjesse | |
| 8,104,000 B2 | 1/2012 | Bjesse | |
| 8,117,571 B1* | 2/2012 | Chauhan et al. | 716/104 |
| 8,307,313 B2 | 11/2012 | Baumgartner et al. | |
| 2007/0168372 A1* | 7/2007 | Baumgartner et al. | 707/101 |
| 2008/0228694 A1* | 9/2008 | Baumgartner et al. | 707/1 |
| 2010/0058264 A1* | 3/2010 | Yoshino | 716/5 |
| 2010/0077366 A1* | 3/2010 | Bjesse | 716/5 |
| 2010/0107132 A1* | 4/2010 | Bjesse | 716/5 |
| 2011/0276931 A1 | 11/2011 | Baumgartner et al. | |
| 2012/0054701 A1* | 3/2012 | Baumgartner et al. | 716/106 |

OTHER PUBLICATIONS

German, Steven M.; Abstraction for Arrays in Integrated Circuit Models; U.S. Appl. No. 13/197,061, filed Aug. 3, 2011.

* cited by examiner

*Primary Examiner* — Suresh Memula
(74) *Attorney, Agent, or Firm* — James L. Baudino; Matthew W. Baca

(57) ABSTRACT

According to one aspect of the present disclosure, a method and technique for vectorization of bit-level netlists is disclosed. The method includes: receiving a bit-level netlist defining a plurality of registers; analyzing propagation of read data associated with the registers through logic of the bit-level netlist; and forming a plurality of vector-level bundles of registers based on the propagation of read data through the logic, wherein the plurality of vector-level bundles differ based on differences in references to memory arrays of the bit-level netlist by respective registers of the vector-level bundles.

22 Claims, 13 Drawing Sheets

```
1.  vectorize_registers() {
2.    current_bundle = 0
3.    *.bundle_list = {}

4.    foreach gate "g" {
5.      if ( is_register (g) ) {
6.        g.bundle_list = { current_bundle }
7.      }
8.    }

9.    old_bundle_count = 1

10.   while (1) {
11.     bundle_count = 0
12.     ref_count[*] = 0

13.     for each array read port "p" {
14.       current_bundle++
15.       for each data pin "d" associated with p {
16.         d.bundle_list = { current_bundle }
17.       }
18.     }

19.     foreach register "r" {
20.       next_state_bundle_list = bundle_register_fanin(r.next_state)
21.       r.bundle_list = next_state_bundle_list 22.       if ( ref_count[next_state_bundle_list] == 0 ) {
23.         bundle_count++
24.       }

25.       ref_count[next_state_bundle_list] += 1
26.     }

27.     if(old_bundle_count >= bundle_count) {
28.       break;
29.     }
30.     old_bundle_count = bundle_count
31.   }
```

CONTINUES ON NEXT PAGE

FIG. 4

CONTINUED FROM PREVIOUS PAGE

```
32.   reg_vectors[*] = {}
33.   foreach register "r" {
34.      reg_vectors[r.bundle_list}] = reg_vectors[r.bundle_list] union { r }
35.   }
36. }

37. bundle_register_fanin(node) {

38.   if ( is_combinational(node) ) {
39.      cur_bundle_list = {}
40.      foreach input "i" to node {
41.         i_bundle_tag = bundle_register_fanin(i)

42.         cur_bundle_list = cur_bundle_list union i_bundle_tag
43.      }
44.      node.bundle_list = current_bundle_list
45.      return node.bundle_list
46.   }
47.   else {
48.      return node.bundle_list
49.   }
50. }
```

FIG. 4 (CONT'D)

```
1. vectorize_multiplexors() {
2.   mux_vectors[*] = {}
3.   *.mux_record = NULL 4.   foreach gate "g" {
5.     rec = decode_mux(g);
6.     if(rec != NULL) {
7.       g.mux_record = <s, d0, d1>

8.       mux_vectors[s] = mux_vectors[s] union { g }
9.     }
10.  }

11. decode_mux (node) {
12.   if ( is_and (node) && ( < children( left(node) ), children( right(node) ) > can be permuted to form < {s, d1}, {NOT s, d0} >) ) {
13.     return <s, d0, d1>;
14.   }
15.   return NULL;
16. }
```

FIG. 5

```
1.  vectorize_pifs() {
2.    vectorize_registers()

3.    *.pif_set = {}

4.    foreach gate "g" {
5.      vectorize_pifs_fi( g )
6.    }

7.    pif_vectors[*] = {}

8.    foreach gate "g" {
9.      if(g.pif_set is not EMPTY or INVALID , and contains more than 1 orthogonality record ) {
10.       pif_bundle = {}
11.       for each orthogonality record "rec" in g.pif_set {
12.         pif_bundle = pif_bundle union < rec.bundle_list, rec.care_set >
13.       }

14.       pif_vectors[pif_bundle] = pif_vectors[pif_bundle] union { g }
15.     }
16.   }
17. }

18. vectorize_pifs_fi( node ) {
19.   if ( is_register( node ) || is_array( node ) ) {
20.     if( node.bundle_list == {} ) {
21.       node.pif_set = EMPTY
22.     }
23.     else {
24.       node.pif_set = { < node.bundle_list, {node}, {}, {} > } // recall format: < bundle_list, {reference_set}, {care_set}, {ui_set} >
25.     }
26.   }
27.   else if ( is_and( node) ) {
28.     if( left(node).pif_set == {}) vectorize_pifs_fi( left(node) )
29.     if( right(node).pif_set == {}) vectorize_pifs_fi( right(node) )

30.     if (left(node).pif_set or right(node).pif_set are INVALID) {
31.       node.pif_set = INVALID
32.       return
33.     }
```

CONTINUES ON NEXT PAGE

FIG. 6

CONTINUED FROM PREVIOUS PAGE

```
34.     if (both of left(node).pif_set or right(node).pif_set are EMPTY) {
35.        node.pif_set = EMPTY
36.     }
37.     else if (only one of left(node).pif_set or right(node).pif_set are EMPTY) {
38.        pif_set1 = non-EMPTY child pif_set
39.        pif_set1.care_set = pif_set1.care_set union EMPTY-child
40.        node.pif_set = pif_set1
41.     }
42.     else if (left(node).pif_set and right(node).pif_set each have an ortho_ record with a common bundle_list) {
43.        let l_ortho_record, r_ortho_record be an entry of left (node).pif_set and right(node).pif_set, respectively, which share a common bundle _list 44.        care_set1 = l_ortho_record.care_set intersection r_ortho_record.care_set 45.        if ( care_set1 is empty ) {
46.           node.pif_set = INVALID
47.           return
48.        }

49.        ui_set1 = (l_ortho_record.care_set union r_ortho_record.care_set) - care_set1
50.        ui_set1 = ui_set1 union l_ortho_record.ui_set union r_ortho_record.ui_set 51.        ortho_record1 = < l_ortho_record.bundle_list, l_ortho_record.reference_set union r_ortho_record.reference_set, care_set1, ui_set1} >

52.        pif_set1 = ( left(node).pif_set - l_ortho_record ) union ( right(node).pif_set - r_ortho_record )

53.        for each ortho_record in pif_set1, move its care_set elements to ui_set which are not orthogonal to care_set1 // prune their care_sets 54.        node.pif_set = pif_set1 union ortho_record1
55.     }
56.     else if (left(node).pif_set and right(node).pif_set each have an ortho _record with a different bundle_list yet orthogonal care_sets) {
57.        let l_ortho_record, r_ortho_record be the entry of left (node).pif_set and right(node).pif_set, respectively, which have a different bundle _list yet orthogonal care_sets
```

CONTINUES ON NEXT PAGE

FIG. 6 (CONT'D)

CONTINUED FROM PREVIOUS PAGE

```
58.    l_care_set = l_ortho_record.care_set intersection INVERSE (r_ortho_record.care_set)
59.    l_ui_set = l_ortho_record.ui_set union { l_ortho_record.care_set - l_care_set }

60.    r_care_set = r_ortho_record.care_set intersection INVERSE (l_ortho_record.care_set)
61.    r_ui_set = r_ortho_record.ui_set union { r_ortho_record.care_set - r_care_set }

62.    pif_set1 = < left(node).pif_set - l_ortho_record >
63.    for each ortho_record in pif_set1, move its care_set elements which are not in r_care_set to
ui_set 64.    pif_set2 = < right(node).pif_set - r_ortho_record >
65.    for each ortho_record in pif_set2, move its care_set elements which are not in l_care_set to
ui_set 66.    ortho_record1 = < l_ortho_record.bundle_list, l_reference_set, l_care_set, l_ui_set >
67.    ortho_record2 = < r_ortho_record.bundle_list, r_reference_set, r_care_set, r_ui_set >

68.    node.pif_set = pif_set1 union pif_set2 union ortho_record1 union ortho_record2
69.    }
70.    else {
71.      node.pif_set = INVALID
72.    }
73.  }
74.  else
75.    node.pif_set = EMPTY
76.  }
77. }
```

FIG. 6 (CONT'D)

VECTORIZATION OF BIT-LEVEL NETLISTS

BACKGROUND

In integrated circuit and hardware design, verification refers to the process of proving that a design satisfies its specification. For example, digital logic circuits implement a logic function and represent the core of any computing processing unit. These designs are often of substantial complexity, comprising a diversity of bit-level control logic, data paths, and performance-related artifacts including pipelining, multi-threading, out-of-order execution, and power-saving techniques. Memory arrays are ubiquitous in hardware designs, representing caches, main memory, lookup tables, and the like.

Before a logic design is constructed in real hardware, its design is tested and the operation thereof verified against a design specification. Typically, the specification of a verification problem includes a netlist-based representation of the design and a set of expected values for specified nets under specified conditions. However, verification techniques generally require computational resources which are exponential with respect to the size of the design under test. In particular, many formal analysis techniques require exponential resources with respect to the number of state elements in the design under test. Thus, it's often desirable to reduce the complexity of a design under verification. For example, abstraction techniques may be used to reduce memory array sizes (e.g., to reduce the number of rows which need to be modeled), to enable reductions in the size of the netlist under verification, and thereby reduce verification complexity.

BRIEF SUMMARY

According to one aspect of the present disclosure a method and technique for vectorization of bit-level netlists is disclosed. The method includes: receiving a bit-level netlist defining a plurality of registers; analyzing propagation of read data associated with the registers through logic of the bit-level netlist; and forming a plurality of vector-level bundles of registers based on the propagation of read data through the logic, wherein the plurality of vector-level bundles differ based on differences in references to memory arrays of the bit-level netlist by respective registers of the vector-level bundles.

BRIEF DESCRIPTION OF THE SEVERAL VIEWS OF THE DRAWINGS

For a more complete understanding of the present application, the objects and advantages thereof, reference is now made to the following descriptions taken in conjunction with the accompanying drawings, in which:

FIG. 4 is a diagram depicting an embodiment of pseudo-code for performing vectorization of bit-level netlists according to the present disclosure;

FIG. 5 is a diagram depicting another embodiment of pseudo-code for performing vectorization of bit-level netlists according to the present disclosure;

FIG. 6 is a diagram depicting another embodiment of pseudo-code for performing vectorization of bit-level netlists according to the present disclosure;

DETAILED DESCRIPTION

Figure 1:
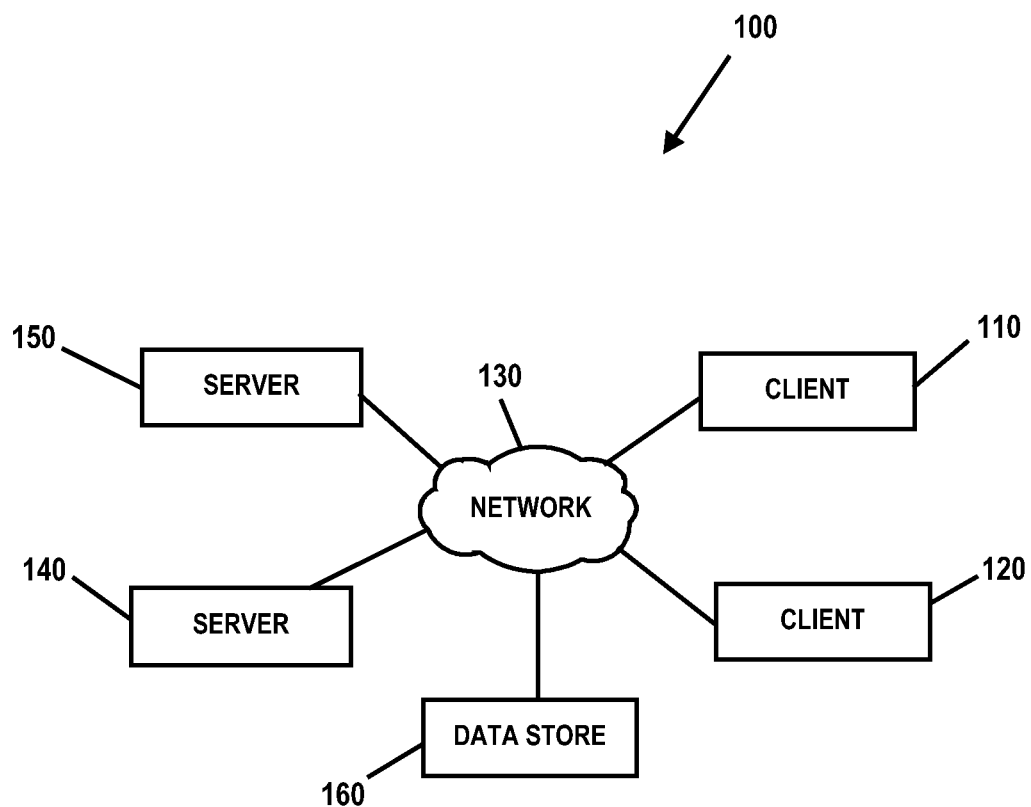
FIG. 1 is an embodiment of a network of data processing systems in which the illustrative embodiments of the present disclosure may be implemented.

Embodiments of the present disclosure provide a method and technique for vectorization of bit-level netlists. For example, in some embodiments, the method and technique includes: receiving a bit-level netlist defining a plurality of registers; analyzing propagation of read data associated with the registers through logic of the bit-level netlist; and forming a plurality of vector-level bundles of registers based on the propagation of read data through the logic, wherein the plurality of vector-level bundles differ based on differences in references to memory arrays of the bit-level netlist by respective registers of the vector-level bundles. Embodiments of the present disclosure enable a bit-level design to be represented in a higher-level form, over bundled vectors of data. Embodiments of the present disclosure bundle into vectors registers from a bit-level netlist according to compatible memory array references by allocating a distinct set of tags or identifiers with each array read port. Such bundling may be used for a variety of applications (e.g., for array abstraction). Computing a bundling of registers which reflects the manner in which array references propagate through the system helps enable a smaller abstraction, without which the array abstraction process may need to consider bit-level registers to be of different references. Further, arrays often do comprise vectors of related data; having an array intact in the bit-level netlist offers some insight into how data vectors propagate through the design. Embodiments of the present disclosure may also be used to bundle bit-level multiplexor topologies into vectors, as well as identify bundled "partially-interpreted functions" in a bit-level netlist.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer usable or computer readable medium(s) may be utilized. The computer readable medium may be a computer readable signal medium or a computer readable storage medium. A computer readable storage medium may be, for example but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2:
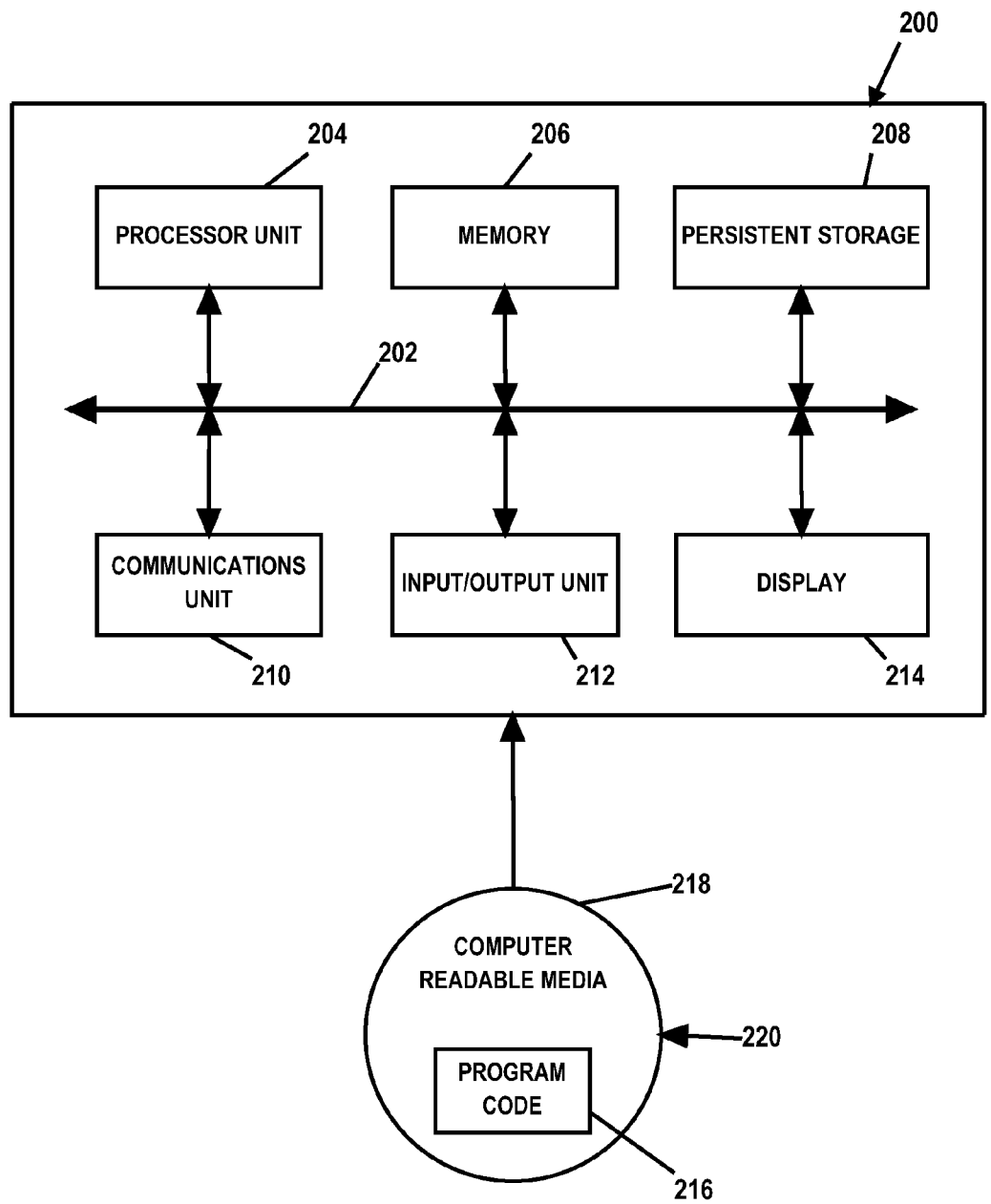
FIG. 2 is an embodiment of a data processing system in which the illustrative embodiments of the present disclosure may be implemented.

With reference now to the Figures and in particular with reference to FIGS. 1-2, exemplary diagrams of data processing environments are provided in which illustrative embodiments of the present disclosure may be implemented. It should be appreciated that FIGS. 1-2 are only exemplary and are not intended to assert or imply any limitation with regard to the environments in which different embodiments may be implemented. Many modifications to the depicted environments may be made.

FIG. 1 is a pictorial representation of a network of data processing systems in which illustrative embodiments of the present disclosure may be implemented. Network data processing system 100 is a network of computers in which the illustrative embodiments of the present disclosure may be implemented. Network data processing system 100 contains network 130, which is the medium used to provide communications links between various devices and computers connected together within network data processing system 100. Network 130 may include connections, such as wire, wireless communication links, or fiber optic cables.

In some embodiments, server 140 and server 150 connect to network 130 along with data store 160. Server 140 and server 150 may be, for example, IBM System p® servers. In addition, clients 110 and 120 connect to network 130. Clients 110 and 120 may be, for example, personal computers or network computers. In the depicted example, server 140 provides data and/or services such as, but not limited to, data files, operating system images, and applications to clients 110 and 120. Network data processing system 100 may include additional servers, clients, and other devices.

In the depicted example, network data processing system 100 is the Internet with network 130 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

FIG. 2 is an embodiment of a data processing system 200 such as, but not limited to, client 110 and/or server 140 in which an embodiment of a system for enabling vectorization of bit-level netlists according to the present disclosure may be implemented. In this embodiment, data processing system 200 includes a bus or communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

In some embodiments, memory 206 may be a random access memory or any other suitable volatile or non-volatile storage device. Persistent storage 208 may take various forms depending on the particular implementation. For example, persistent storage 208 may contain one or more components or devices. Persistent storage 208 may be a hard drive, a flash memory, a rewritable optical disk, a rewritable magnetic tape, or some combination of the above. The media used by persistent storage 208 also may be removable such as, but not limited to, a removable hard drive.

Communications unit 210 provides for communications with other data processing systems or devices. In these examples, communications unit 210 is a network interface card. Modems, cable modem and Ethernet cards are just a few of the currently available types of network interface adapters. Communications unit 210 may provide communications through the use of either or both physical and wireless communications links.

Input/output unit 212 enables input and output of data with other devices that may be connected to data processing system 200. In some embodiments, input/output unit 212 may provide a connection for user input through a keyboard and mouse. Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer implemented instructions, which may be located in a memory, such as memory 206. These instructions are referred to as program code, computer usable program code, or computer readable program code that may be read and executed by a processor in processor unit 204. The program code in the different embodiments may be embodied on different physical or tangible computer readable media, such as memory 206 or persistent storage 208.

Program code 216 is located in a functional form on computer readable media 218 that is selectively removable and may be loaded onto or transferred to data processing system 200 for execution by processor unit 204. Program code 216 and computer readable media 218 form computer program product 220 in these examples. In one example, computer readable media 218 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer readable media 218 also may take the form of a persistent storage, such as a hard drive, a thumb drive, or a flash memory that is connected to data processing system 200. The tangible form of computer readable media 218 is also referred to as computer recordable storage media. In some instances, computer readable media 218 may not be removable.

Alternatively, program code 216 may be transferred to data processing system 200 from computer readable media 218 through a communications link to communications unit 210 and/or through a connection to input/output unit 212. The communications link and/or the connection may be physical or wireless in the illustrative examples.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200. Other components shown in FIG. 2 can be varied from the illustrative examples shown. For example, a storage device in data processing system 200 is any hardware apparatus that may store data. Memory 206, persistent storage 208, and computer readable media 218 are examples of storage devices in a tangible form.

Figure 3:
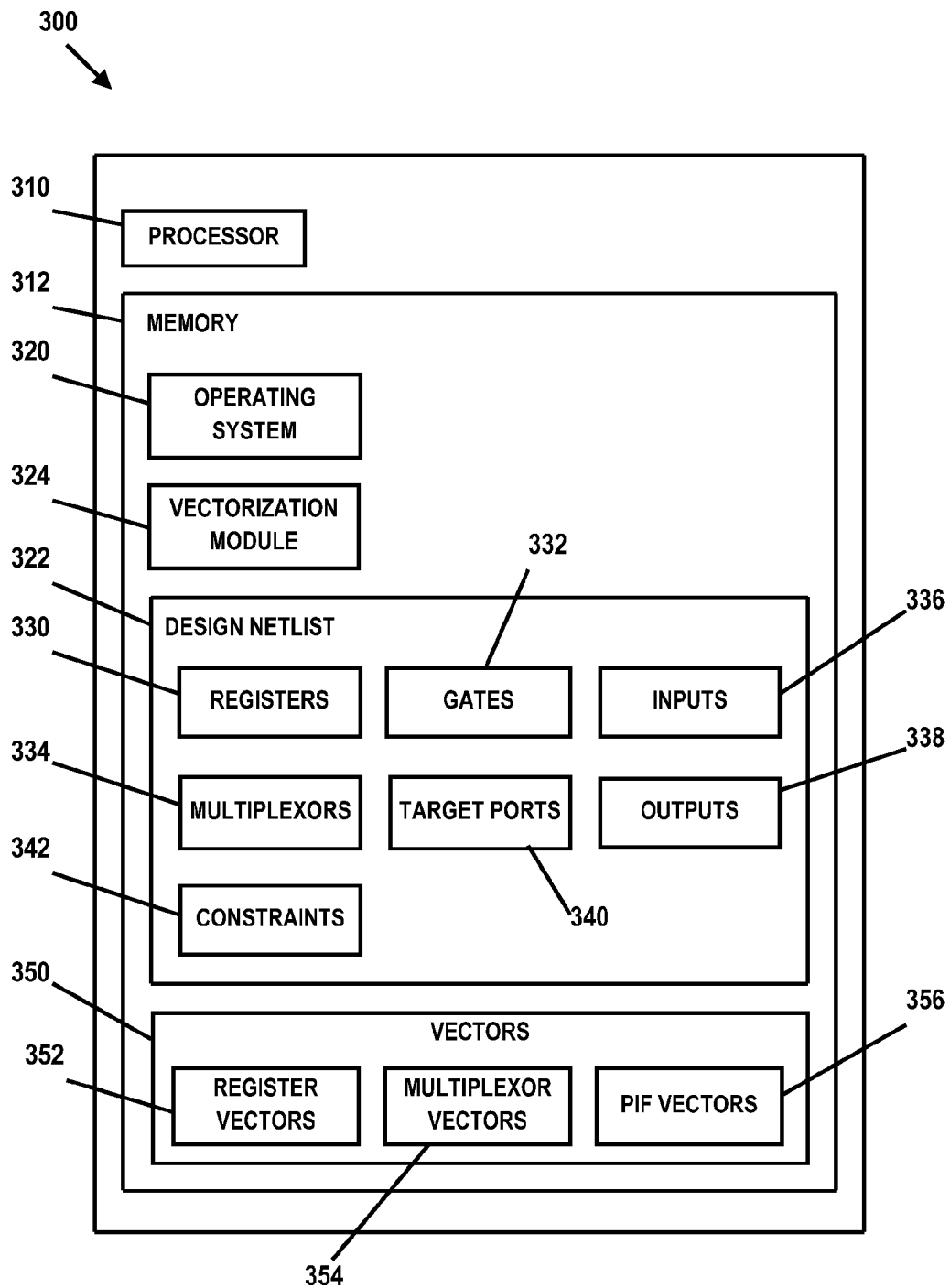
FIG. 3 is a diagram illustrating an embodiment of a data processing system for vectorization of bit-level netlists in which illustrative embodiments of the present disclosure may be implemented.

FIG. 3 is an illustrative embodiment of a system 300 for the vectorization of bit-level netlists. System 300 may be implemented on data processing systems or platforms such as, but not limited to, servers 140 and/or 150, clients 110 and/or 120, or at other data processing system locations. In the embodiment illustrated in FIG. 3, system 300 comprises a processor 310 and a storage unit, such as a memory 312 (e.g., RAM). In FIG. 3, memory 312 includes an operating system 320, a design netlist 322 and a vectorization module 324. Design netlist 322 comprises a netlist defining an interconnection of integrated circuit elements of a particular logic design. For example, netlist 322 may comprise various types of logic artifacts such as registers 330 (e.g., latches or memory units), gates 332 (e.g., combinational functions/logic (e.g., Boolean functions)), multiplexors 334, inputs 336, outputs 338, target nodes or ports 340 and various functional constraints 342. A netlist (such as design netlist 322) contains a directed graph with vertices representing gates, and edges representing interconnections between those gates. The gates have associated functions, such as constants, primary inputs (hereafter referred to as RANDOM gates), combinational logic (such as AND gates), simple sequential elements (hereafter referred to as registers), and memory arrays. Registers have two associated components: their next-state functions, and their initial-value functions, both represented as other gates in the graph. Semantically, for a given register, the value appearing at its initial-value gate at time "0" ("initialization" or "reset" time) will be applied as the value of the register itself; the value appearing at its next-state function gate at time "i" will be applied to the register itself at time "i+1". A "state" is a valuation to the registers of a netlist. A state which may be witnessed within 0 or more transitions from the initial state is a "reachable state". A gate may also be called a "signal" which refers to the output of a gate, hence these two terms may be used interchangeably. In a netlist representation called an And/Inverter Graph, the combinational gates are 2-input AND gates. Inverters are implicitly represented by allowing a reference to a gate or signal to also indicate an implicit inversion. It is often the case that a netlist is represented entirely at the bit-level (aside possibly from memory arrays as discussed below); each register and gate is distinct.

Memory arrays represent two-dimensional grids of registers (sometimes referred to as "cells"), arranged as rows versus columns. The contents of memory arrays are read or written via dedicated "ports" (e.g., target ports 340) of two types: read ports and write ports. Ports each have three components: an address, a data vector, and an enable. The address is a vector of references to other signals, whose valuation indicates which row is to be accessed. The enable is a signal which indicates whether or not the given port is being accessed: an access occurs only if it evaluates to 1. The data is a vector of references to signals whose valuate indicates what value is to be written to the given row (if enabled) in the case of a write port, and represents the array contents produced for the given row in case of an enabled read. Note that only read data port "pins" are outputs of the array in that they produce values consumed by the rest of the netlist; all other port entity values are inputs to the array in that they are produced by the rest of the netlist.

Embodiments of the present disclosure enable bundling of a bit-level netlist to a vector-level. For example, simulation engine 310 is configured to analyze/process design netlist 322 and vectorize the bit-level design representation into a higher-level form, over bundled vectors of data. Embodiments of the present disclosure facilitate the use of abstraction techniques to reduce memory array sizes (e.g., to reduce the number of rows which need to be modeled), to enable datapath reductions to reduce the width of data vectors and thus verification complexity, or to enable emerging Satisfiability Modulo Theories solvers to more scalably reason about the design in a higher-level form. In some instances, hardware designs often contain artifacts not directly associated with their primary functionality which require a hardware description language (HDL) representation to be implemented at the bit-level. Examples of such artifacts include scan chains, trace bus logic, initialization and test logic, circuit-accurate libraries which fragment arrays into single-bit columns, power optimization logic, and the presence of bit-level logic optimizations to ensure that the design ultimately closes timing. Further, even if the front-end design has a word-level topology, such topology is destroyed by the time the design passes through a synthesis flow, whereas an equivalence checker may benefit in scalability if it is able to reconstruct higher-level structure.

Simulation engine 310 is configured to bundle bit-level arrays into vectors which reflect how the bit-level arrays propagate array read data. Engine 310 is also configured to bundle bit-level multiplexor topologies into vectors. Engine 310 is further configured to identify bundled "partially-interpreted functions" (described below) in a bit-level netlist, reflecting orthogonal propagation of multiple data vectors, as well as the conditions under which the data vectors propagate though the partially-interpreted function. Simulation engine 310 may comprise software, logic and/or executable code for performing various functions as described herein (e.g., residing as software and/or an algorithm running on a processor unit, hardware logic residing in a processor or other type of logic chip, centralized in a single integrated circuit or distributed among different chips in a data processing system). In FIG. 3, memory 312 also includes vectors 350 representing the vector-level data produced/output by vectorization module 324. For example, in the illustrated embodiment, vectors 350 comprise register vectors 352, multiplexor vectors 354 and partially-interpreted function (pif) vectors 356 representing, respectively, bundled vectors of data associated with registers 330, multiplexors 334 and partially-interpreted functions or sets of orthogonality records of design netlist 322. However, it should be understood that embodiments of the present disclosure may be applied to other types of netlist elements.

FIG. 4 is a diagram illustrating an embodiment of pseudo-code for performing bundling operations of a bit-level netlist to vector-level according to the present disclosure. In FIG. 4, the pseudo-code is directed toward the bundling of registers in a bit-level netlist (e.g., design netlist 322) into vectors, where each vector is uniform in how it interacts with references to arrays and to other register bundles. The process begins by bundling all registers together, then iteratively breaking down bundles into smaller bundles until a fixed point is reached (e.g., when no further separation or breaking of bundles to lower level bundles is made based on uniformity of array read references). The term "current_bundle" is a tag used to represent a given array read reference, which is implemented in the illustrated pseudo-code as an integer. The term "bundle_list" is a set of current_bundle tags, and each gate "g" in the netlist has an associated bundle_list referred to as "g.bundle_list". The term "ref_counts" is a data structure which is used to indicate the number of registers which share a particular bundle_list set value (i.e., it maps values of bundle_list sets to integers). The term "reg_vectors" is a data structure used to associate a set of registers with a particular bundle_list set value, namely those registers which have that particular bundle_list value upon termination of the algorithm.

At line 1 of the depicted pseudo-code, the vectorization of registers begins. At line 3, every gate's bundle_list is initialized to emptyset. Lines 4-8 initializes every register to be in the same bundle-list. At line 7, registers have bundle-list initialized into a singleton set including the initial current_bundle tag while other gates remain initialized to empyset. At line 9, an integer variable is used to detect convergence of the following "while" loop (e.g., beginning at line 10) such that when an iteration of the "while" loop does not increase the number of distinct bundles, the "while" loop is aborted (line 28). Each iteration of the "while" loop creates fresh current_bundle tags for each array read port and propagates them through the netlist. The variable at line 11 is also used to detect loop convergence, and the pseudo-code at line 12 initializes ref_count to zero for each possible value of bundle_list in each iteration.

Lines 13-18 of the depicted pseudo-code allocates a fresh bundle_list for each array read port (and may be configured for alternate applications). Lines 19-21 the pseudo-code propagates bundle lists through registers using the function bundle_register_fanin. At line 22, if the new bundle_list for register "r" has not been counted yet, it is counted. At line 25, the pseudo-code increments the reference count for this bundle_list so it is not counted again later. At line 27, if the number of distinct bundle_lists in this iteration has not increased, the pseudo-code exits the "while" loop. Lines 32-36 of the depicted pseudo-code groups registers with identical bundle_lists into the same vector. Line 32 initializes vectors to emptyset for each register. Line 37 of the depicted pseudo-code is a function used to propagate bundle_list references through the netlist (called in line 20). Line 38 of the depicted pseudo-code combines the bundle_lists of each input to a combinational gate.

In the above example, each read data pin of a given port has the same current_bundle (assigned in lines 15-17). Also, each array read port gets its own distinct current_bundle value via incrementing on line 14. Further, in each iteration of the "while" loop of lines 10-31, new current_bundle references are assigned to each read port. This allows the algorithm to bundle according to propagation of past smaller current_bundle values, as well as current larger current_bundle_values, similar to how read data propagates through a netlist over time. Thus, current_bundle may be viewed as a unique label for a "current" or "past" read operation.

When vectorize_registers returns, the process will have bundled into reg_vectors all the registers in a bit-level netlist according to compatible array references, which is performed by allocating a distinct bundle_list with each array read port. Embodiments of the present disclosure may be used for a variety of applications such as, but not limited to, array abstraction (e.g., computing a bundling of registers which reflects the manner in which array references propagate through the system enables a smaller abstraction, without which the array abstraction process may need to consider bit-level registers to be of different references). Further, arrays often do comprise vectors of related data; having an array intact in the bit-level netlist offers some insight into how data vectors propagate through the design. The above process may also be configured for other purposes (e.g., initial vectors may be seeded based upon other design information such as vector signal declarations in HDL source). Also, the process may be seeded by the availability of word-level operators in the netlist (e.g., comparators, arithmetic, etc.).

Embodiments of the present disclosure may also be used to bundle other types of logic. While bundling of registers is desirable, bundling other types of logic for a given application may be desirable. For example, in array abstraction, bundling the combinational logic in the fanout of arrays and registers may be desirable in a way that reflects word-level read propagation, which enables smaller array abstractions. For such applications, it is desirable to be able to detect bundled logic through which orthogonal array references propagate (e.g., a multiplexor which can either propagate a new array read or a prior one being held in a bundle of registers). More generally, bit-level netlists may have logic which orthogonally propagates data which does not have the typical multiplexor topology of "mux_out <=if (select) then (data1) else (data0)". For example, a bit-level netlist may use conjunctions to control the propagation of data, such as "output <=(data° AND conjuncts0) OR (data 1 AND conjuncts 1) OR (data2 AND conjuncts2)".

FIG. 5 is a diagram illustrating another embodiment of pseudo-code for performing bundling operations of a bit-level netlist to vector-level according to the present disclosure. In FIG. 5, the pseudo-code is directed toward the bundling of multiplexors in a bit-level netlist (e.g., design netlist 322) into vectors. A bit-level multiplexor is represented as a tuple <selector, data_0, data_1> where "selector" is a signal. The term "data_0" is a signal whose value is propagated through the multiplexor when the selector evaluates to 0. The term "data_1" is a signal whose value is propagated through the multiplexor when the selector evaluates to 1. A bundled vector-level multiplexor is represented by a vector of bit-level multiplexors which have the identical selector. The pseudo-code of FIG. 5 annotates each gate "g" with a bit-level multiplexor tuple on an associated data structure referred to as "g.mux_record", which will be NULL if "g" cannot be represented as a bit-level multiplexor. The term "mux_vectors" is a data structure used to associate a set of gates which have non-NULL mux_records, which further have identical selectors (i.e., it maps signals (used as selectors by other multiplexors) to sets of signals (which have non-NULL mux records with the corresponding selector)). The pseudo-code depicted in FIG. 5 is based on the netlist being represented as an And/Inverter Graph, where the combinational primitives are 2-input AND gates or inverters; however, it can be extended to other logic types. The functions "left(node)" and "right(node)" return the respective inputs of a given AND node. The function "children(node)" returns the set of both inputs to a given AND node.

At line 1 of the depicted pseudo-code, the vectorization of multiplexors begins. At line 2, the pseudo-code initializes mux_vectors for every gate to emptyset. At line 3, the pseudo-code initializes every gate's mux_record to NULL. At line 5, the process checks if gate "g" has the topology of a multiplexor. If not, NULL will be returned. If so, a triple of the form <s, d0, d1> is returned, and the multiplexor topology for gate "g" is recorded at line 7. A multiplexor is formed having a pseudo-canonical where "s" is an uninverted signal to enhance bundling.

When vectorize_multiplexors returns, all combinational AND gates of the form "if(s) then (d0) else (d1)" will be bundled according to a common s. The resulting vectors are represented on data structure mux_vectors. Each such resulting bundle may be considered as a vector multiplexor, where the decode mux values of each gate in a given mux_vectors entry provide the bundled vector-level multiplexor selector and data vectors.

In some embodiments, data bundles (e.g., d0 and d1) may propagate through logic under orthogonal conditions, which may have a more general structure which does not adhere to the above topology. FIG. 6 is a diagram illustrating another embodiment of pseudo-code for performing bundling operations of a bit-level netlist to vector-level according to the present disclosure. The pseudo-code of FIG. 6 extracts a more general "partially-interpreted function" (pif) which reflects orthogonality of some of its inputs. A partially-interpreted function (represented as a "pif_set" in the pseudo-code of FIG. 6) is a set of orthogonality records. Each orthogonality record is of the form <bundle_list, reference_set, care_set, ui_set > where "bundle_list" is the value computed from the pseudo-code of FIG. 4, "reference_set" is a set of registers or array read port data pins which have the corresponding "bundle_list" value, "care_set" is the set of signals which must evaluate to 1 (in an And/Inverter Graph, an inverted signal reference means that the non-inverted signal must evaluate to 0) for the referenced bundle_list to propagate to a given node, and "ui_set" is used to represent prior care_set entries which are no longer relevant to a given orthogonality. The process depicted in FIG. 6 annotates gates which refer to multiple distinct bundle_lists, which have orthogonal care_sets. As two orthogonality records over different bundle_sets are combined, their care_sets are pruned to orthogonal entries (i.e., those which cannot be concurrently true)—and the remainder are pushed into the ui_set. There are two specially-treated type of pif sets: EMPTY are those with computed emptyset values, where the special value indicates "computed emptyset" versus "not yet computed"; and INVALID are those which cannot be meaningfully represented as having orthogonal inputs.

As a netlist example, consider that a netlist has two 2-column arrays which have respective read data port pins a0d0 and a0d1 (the two pins associated with array a0), and a1d0 and a1d1 (the two pins associated with array a1). Consider that the fanout of a0d0 goes through an AND gate c0d0 whose other input is gate g0; the fanout of a0d1 goes through an AND gate c0d1 whose other input is also gate g0; the fanout of a1d0 goes through an AND gate c1d0 whose other input is gate g1; the fanout of a1d1 goes through an AND gate c1d1 whose other input is also gate g1. Further, consider that g0 and g1 are orthogonal such that at most one may be asserted at any point in time. Also, consider that c0d0 and c1d0 are ORed together in gate o0, and c0d1 and c1d1 are ORed together in gate o1.

Each read data port pin a?d? has a pif_set with only a singleton orthogonality record of form: <a?d?.bundle_list, {a?d?}, { }, { }> since there are no care_set entries. An empty set is denoted by { }. Implicitly, the care_set is 1 since the array read value propagates to the data pin and is represented by an empty care_set. Each AND gate c?d? will have a pif_set with only a singleton orthogonality record of form: <a?d?.bundle_list, {a?d?}, {g?}, { }>, adding the other AND input to the care_set for the associated read pin. Each OR gate o? will have a pif_set with 2 entries, {<a0d?.bundle_list, {a0d?}, {g0}, { }>, <a1d?.bundle_list, {a1d?}, {g1}, { }> because g0 and g1 are orthogonal.

In the pseudo-code of FIG. 6, "pif_bundle" is a set of tuples of the form <bundle_list, care_set>. The term "pif_vectors" is a data structure used to associate a set of gates which share the same pif_bundle, comprising more than one orthogonality record. Each such set may be vectorized to the same partially-interpreted function. At line 1 of the depicted pseudo-code of FIG. 6, the vectorization of partially interpreted functions (pifs) begins. At line 2, a call to the process depicted in FIG. 4 is made to compute bundle_list values. At line 3, the pif_set for every gate is initialized to emptyset. At line 7, the pif_vectors for every pif_bundle is initialized to emptyset. At line 11, a pif_bundle projects pif_set down to bundle_list and care_set elements. In line 21, an EMPTY return indicates that there are no array references to track orthogonalities over. At line 28, values for child nodes are computed. At line 30, an INVALID indication represents that the inputs cannot be meaningfully represented as orthogonal. At line 37, a child node with EMPTY pif_set (implying emptyset bundle_list) as the care_set for others is used.

At line 42, an attempt is made to combine both children with the common bundle_list into a single "wider" vector (i.e., comprising ortho_records which have a larger number of reference_set elements). At line 44, the process prunes the combined care_set to common members for both children. At line 45, if care_set1 is empty, the children cannot be combined into a wider ortho_record since there are no common care_set member. At line 49, care_set entities that are not common to both children are moved into the combined ui_set. At line 50, the children ui_sets are added into the combined ui_set. Line 51 represents the combined ortho_record. Line 52 enumerates the ortho_records that are not being combined. The care_sets are pruned at line 53. At line 56, an attempt is made to combine child ortho_records if they have orthogonal care_sets for the distinct bundle_lists. At line 58, INVERSE (set) replaces each element of {set} by its complement: an inverted reference in an And/Inverter Graph. Alternatively, a satisfiability check may be used to identify thos elements of l_ortho_record.care_set which are orthogonal (mutually exclusive) to those of r_ortho_record.care_set. Thus, at line 58, the orthogonal care_set elements are identified. At line 59, the remaining care_set elements are moved to ui_set.

At line 62, the ortho_records which are not being combined are enumerated. At line 65, their care_sets are pruned. Line 66 represents the first combined ortho_record. Line 67 represents the second combined ortho_record. Line 70 if there no common bundle_list across children and no orthogonality of care_sets across diverse ortho_records, no pif_set is formed for the particular node. Line 74 continues the process for other node types (e.g., constants or RANDOM gates).

When vectorize_pifs returns, all combinational AND gates which may be represented as partially interpreted functions over orthogonal propagation of multiple bundle_lists as per the process of FIG. 4 will be grouped into vectors via data structure pif_vectors. All gates in the same vector may be treated as multiple outputs of the same pif whose inputs are the union of the {reference_set}, {care_set}, and {ui_set} arguments to all of the orthogonality records associated with the pif_vectors of the outputs. The inputs of the pif may be subdivided into sub-vectors (similarly to the multiplexor process described above wherein the process distinguishes data0 versus data1 versus s): the union of all ui_sets are one sub-vector, the signals referenced in every care_set is the same (though of opposite polarities) and these are treated as one sub-vector, and each reference_set is treated as one sub-vector. Semantically, the pif is interpreted as follows (noting that there will be at most $2^n$ orthogonality records for "n" care_set signals): (ui_set) UNINTERPRETED_OP (if(care_set signals==<0 . . . 0>) then {reference_set correlating to all signals of care_set being 0} else if(care_set signals==<0 . . . 1>) then {reference_set correlating to the last signal of care_set being 1 and the others being 0} . . . }). UNINTERPRETED_OP represents an unspecified combinational function over its inputs.

Figure 7:
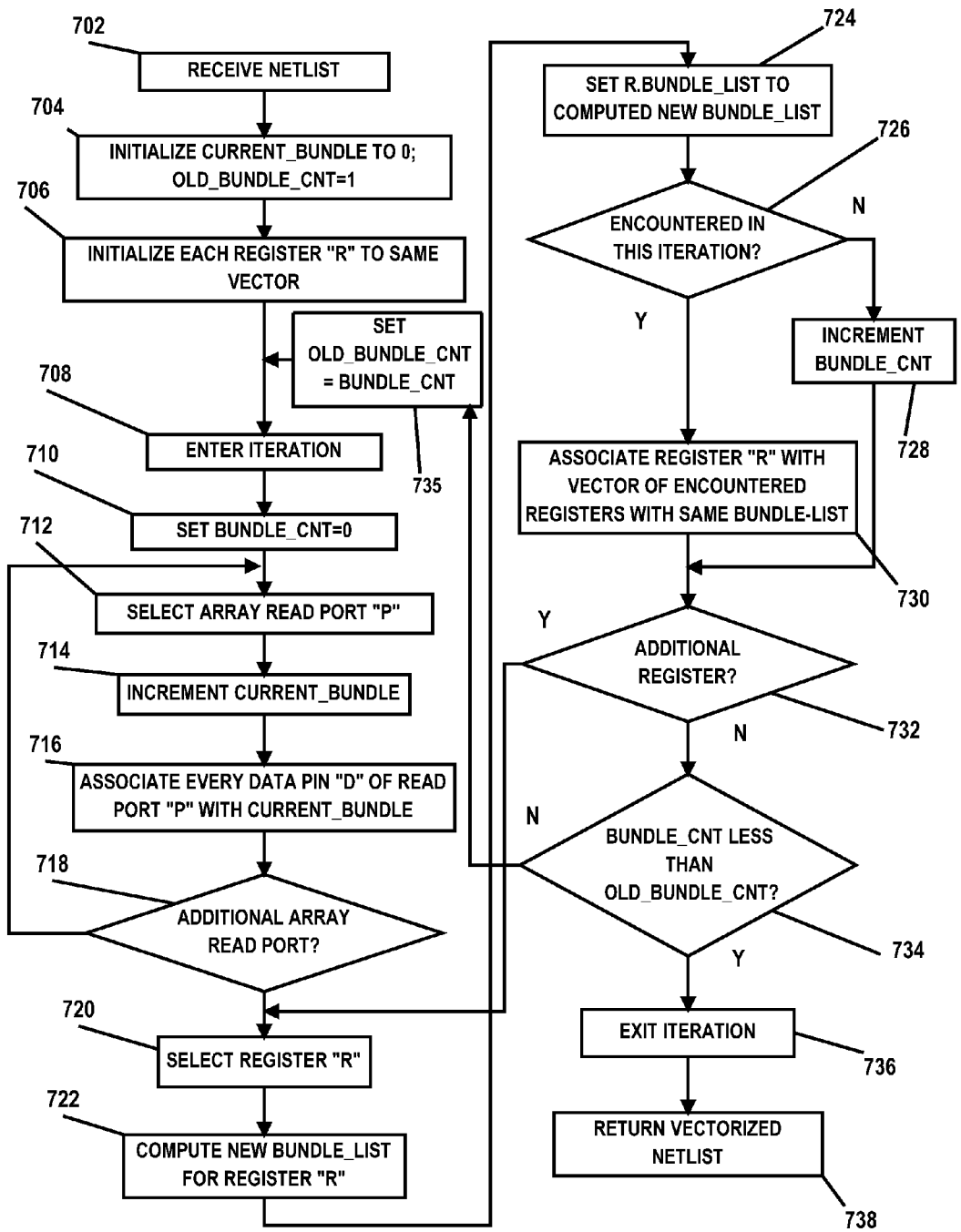
FIG. 7 is a flow diagram illustrating an embodiment of a method for vectorization of bit-level netlists according to the present disclosure.

FIG. 7 is a flow diagram illustrating an embodiment of a method for the vectorization of bit-level design netlists. The method begins at block 702, where a netlist is received. At block 704, current_bundle is initialized to 0 and old_bundle_cnt is set at 1. At block 706, each register "r" is initialized to the same vector by setting its r.bundle_list to current_bundle. At block 708, the process enters an iteration phase for evaluating array read port references during propagation through the netlist. At block 710, bundle_cnt is set to zero. At block 712, a particular array read port "p" is selected. At block 714, current_bundle is incremented. At block 716, every data pin "d" of read port "p" is associated with current_bundle by setting its d.bundle_list to current_bundle. At decisional block 718, a determination is made whether additional array read ports remain. If so, the method proceeds to block 712. I no array read ports remain, the method proceeds to block 720, where a register "r" is selected. At block 722, a new bundle_list for register "r" is computed by combining bundle_list of each gate in the combinational fanin logic of the next-state function of "r". At bock 724, r.bundle_list is set to the computed new bundle_list derived at block 722. At decisional block 726, a determination is made whether the computed new bundle_list has previously been encountered in this iteration. If not, the method proceeds to block 728, where bundle_cnt is incremented, and then the method proceeds to decisional block 732. If it is has been previously encountered, the method proceeds from decisional block 726 to block 730, where register "r" is associated with the vector of previously encountered registers with the same bundle_list. At decisional block 732, a determination is made whether additional registers remain. If so, the method proceeds to block 720. If not, the method proceeds to decisional block 734, where a determination is made whether bundle_cnt is less than or equal to old_bundle_cnt. If not, the method proceeds to block 735, where old_bundle_cnt is set to equal bundle_cnt. If bundle_cnt is less than or equal to old_bundle_cnt at decisional block 734, the method proceeds to block 736, where the iteration is exited. At block 738, the vectorized netlist is returned.

Figure 8:
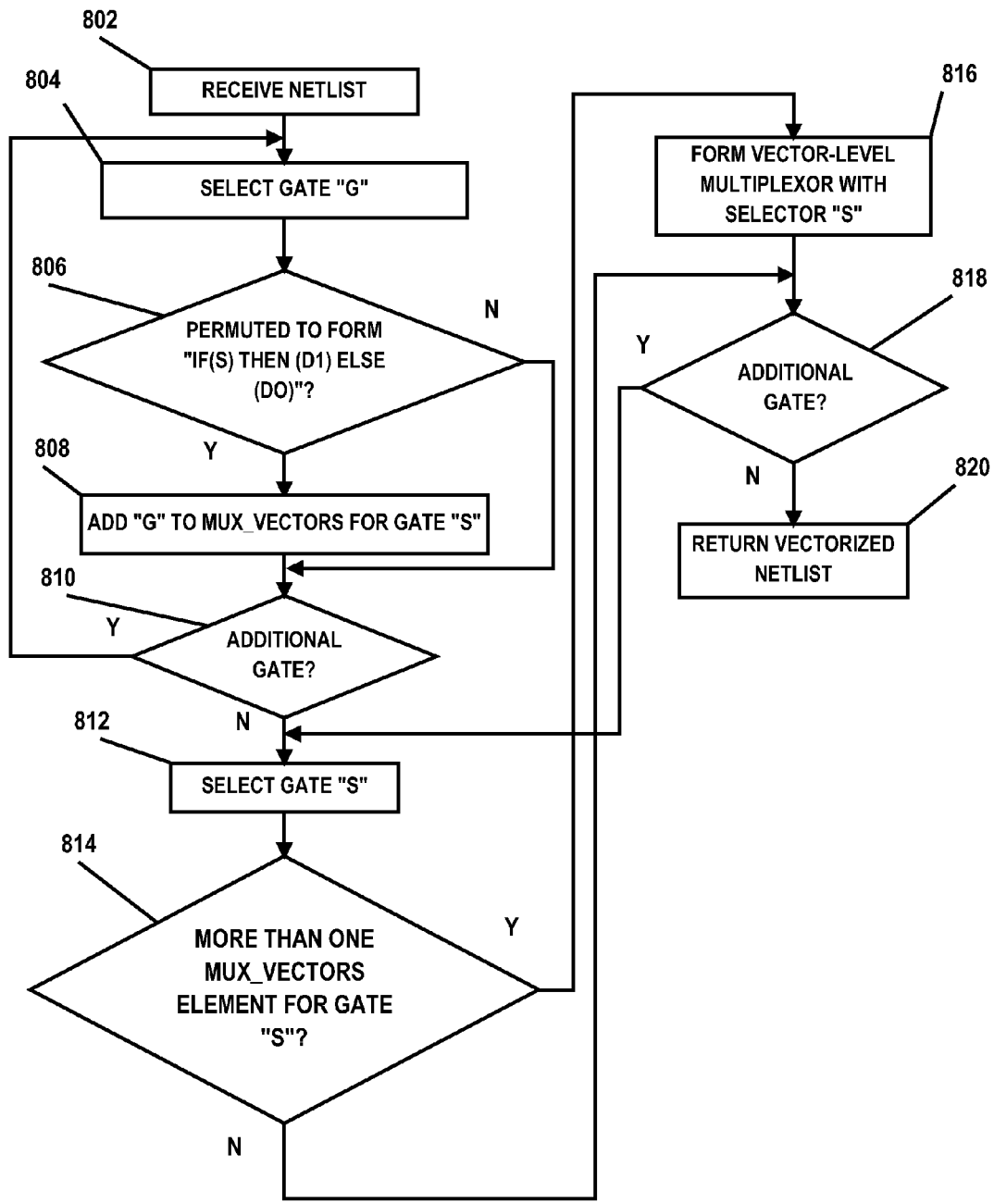
FIG. 8 is a flow diagram illustrating another embodiment of a method for vectorization of bit-level netlists according to the present disclosure.

FIG. 8 is a flow diagram illustrating another embodiment of a method for the vectorization of bit-level design netlists. The method begins at block 802, where a design netlist is received. At block 804, where a gate "g" is selected. At decisional block 806, a determination is made whether gate "g" can be permuted to form "if(s) then (d1) else (d0)". If not, the method proceeds to decisional block 810. If so, the method proceeds to block 808, where gate "g" is added to mux_vectors associated with gate "s". At decisional block 810, a determination is made whether additional gates remain. If so, the method proceeds to block 804. If not, the method proceeds to block 812, where gate "s" is selected. At decisional block 814, a determination is made whether there are more than one mux_vectors elements associated with gate "s". If so, the method proceeds to decisional block 818. If not, the method proceeds to block 816, where a vector-level multiplexor is formed with selector "s". At decisional block 818, a determination is made whether additional gates remain. If so, the method proceeds to block 812. If not, the method proceeds to block 820, where the vectorized netlist is returned.

Figure 9:
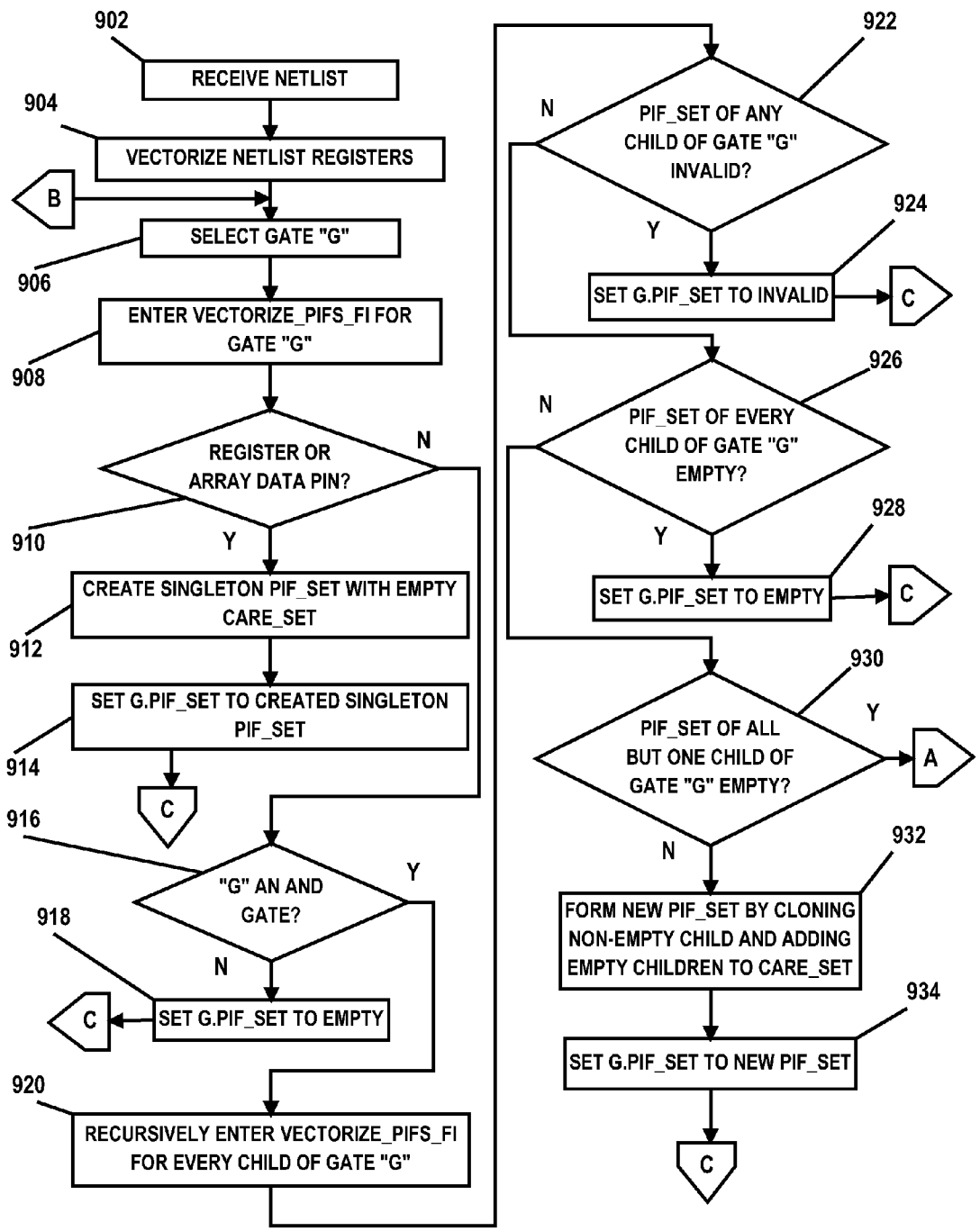
FIG. 9 is a flow diagram illustrating another embodiment of a method for vectorization of bit-level netlists according to the present disclosure.
Figure 9:
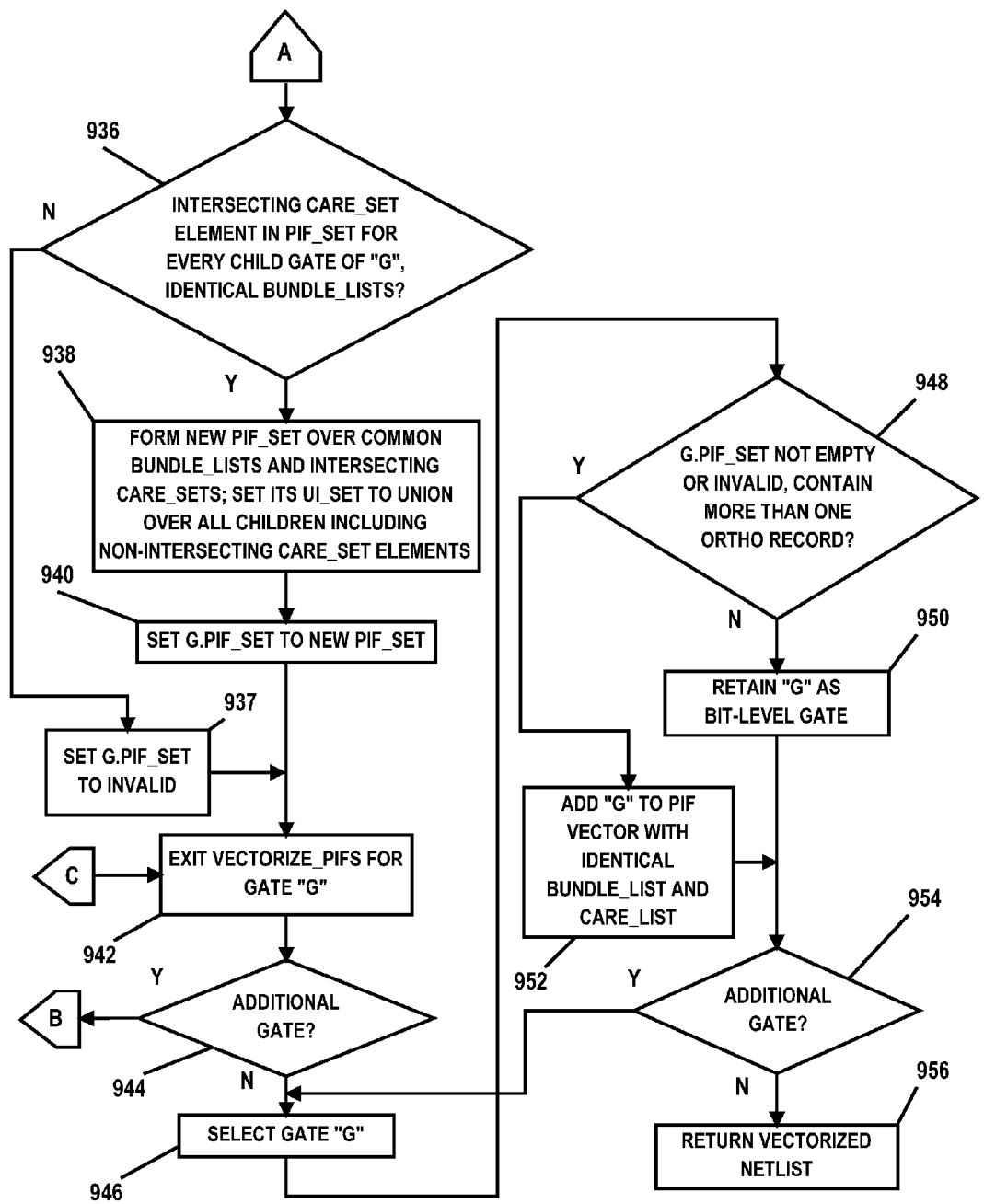

FIG. 9 is a flow diagram illustrating another embodiment of a method for the vectorization of bit-level design netlists. The method begins at block 902, where a design netlist is received. At block 904, netlist registers are vectorized (e.g., according to the process depicted in FIG. 7). At block 906, a gate "g" is selected. At block 908, vectorize_pifs_fi is entered for gate "g". At decisional block 910, a determination is made whether gate "g" is a register or array data pin. If not, the method proceeds to decisional block 916. If so, the method proceeds to block 912, where a singleton pif_set with empty care_set is created. At block 914, g.pif_set is set to the created singleton pif_set. The method then proceeds to block 942. At decisional block 916, a determination is made whether gate "g" is an AND gate. If not, the method proceeds to block 918, where g.pif_set is set to EMPTY. The method then proceeds to block 942. If at decisional block 916 a determination is made that gate "g" is an AND gate, the method proceeds to block 920. At block 920, vectorize_pifs_fi are recursively entered for every child of gate "g".

At decisional block 922, a determination is made whether the pif_set of any child of gate "g" is INVALID. If so, the method proceeds to block 924, where g.pif_set is set to INVALID. The method then proceeds to block 942. If at decisional block 922 it is determined that the pif_set of any child of gate "g" is not INVALID, the method proceeds to block decisional block 926. At decisional block 926, a determination is made whether the pif_set of every child of gate "g" is EMPTY. If so, the method proceeds to block 928, where g.pif_set is set to EMPTY. The method then proceeds to block 942. If at decisional block 926 it is determined that the pif_set of every child of gate "g" is not EMPTY, the method proceeds to decisional block 930. At decisional block 930, a determination is made whether the pif_et of all but one child of gate "g" is EMPTY. If so, the method proceeds to decisional block 936. If not, the method proceeds to block 932, where a new pif_set is formed by cloning that of non-EMPTY child and adding EMPTY children to care_set. At block 934, g.pif_set is set to new pif_set. The method then proceeds to block 942.

At decisional block 936, a determination is made whether there is an intersecting care_set element in pif_set for every child gate of "g" with identical bundle_lists. If not, the method proceeds to block 937, where g.pif_set is set to INVALID. The method then proceeds to block 942. If a positive determination is made at decisional block 936, the method proceeds to block 938, where a new pif_set is formed over common bundle_lists and intersecting care_sets and its ui_set is set to the union over all children including non-intersecting care_set elements. At block 940, g.pif_set is set to the new pif_set. At block 942, vectorize_pifs_fi for gate "g" is exited. At decisional block 944, a determination is made whether additional gates remain. If so, the method proceeds to block 906. If not, the method proceeds to block 946, where gate "g" is selected. At decisional block 948, a determination is made whether g.pif_set is not EMPTY or INVALID and contains more than one orthogonality record. If so, the method proceeds to block 952, where gate "g" is added to pif vector with identical bundle_list and care_set. The method then proceeds to decisional block 954. If a negative determination is made at decisional block 948, the method proceeds to block 950, where gate "g" is retained as a bit-level gate. At decisional block 954, a determination is made whether additional gates remain. If so, the method proceeds to block 946. If not, the method proceeds to block 956, where the vectorized netlist is returned.

Thus, embodiments of the present disclosure enable a bit-level design to be represented in a higher-level form, over bundled vectors of data. Embodiments of the present disclosure bundle into vectors registers from a bit-level netlist according to compatible memory array references by allocating a distinct set of tags or identifiers with each array read port. Such bundling may be used for a variety of applications (e.g., for array abstraction). Computing a bundling of registers which reflects the manner in which array references propagate through the system helps enable a smaller abstraction, without which the array abstraction process may need to consider bit-level registers to be of different references. Further, arrays often do comprise vectors of related data; having an array intact in the bit-level netlist offers some insight into how data vectors propagate through the design (e.g., as is illustrated in the pseudo-code depicted in FIG. 4). Embodiments of the present disclosure may also be used to bundle bit-level multiplexor topologies into vectors, as well as identify bundled partially-interpreted functions in a bit-level netlist.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method, comprising:
receiving a bit-level netlist defining a plurality of registers;
analyzing propagation of read data associated with the registers through logic of the bit-level netlist; and
forming a plurality of vector-level bundles of registers based on the propagation of read data through the logic, wherein the plurality of vector-level bundles differ based on differences in references to memory arrays of the bit-level netlist by respective registers of the vector-level bundles.

2. The method of claim 1, further comprising:
grouping all registers of the bit-level netlist into a first vector-level bundle; and
iteratively breaking the first vector-level bundle into successively smaller vector-level bundles based on uniformity of references to the memory arrays of the respective registers.

3. The method of claim 1, wherein the bit-level netlist defines a plurality of multiplexors, and further comprising bundling the multiplexors into a plurality of vector-level multiplexors based on common selectors.

4. The method of claim 1, further comprising forming a plurality partially-interpreted function (pif) vectors from the bit-level netlist based on orthogonality of data propagation through the bit-level netlist.

5. The method of claim 1, further comprising:
assigning a tag to each read port of the memory arrays;
propagating read operations through the bit-level netlist;
analyzing read references to the tags; and
differentiating the registers into the respective vector-level bundles based on a sensitivity of the respective registers to the read operations.

6. The method of claim 4, further comprising identifying logic of the bit-level netlist not representable as having orthogonal inputs.

7. A system, comprising:
a processor; and
a vectorization module executable by the processor to:
receive a bit-level netlist defining a plurality of registers;
analyze propagation of read data associated with the registers through logic of the bit-level netlist; and
form a plurality of vector-level bundles of registers based on the propagation of read data through the logic, wherein the plurality of vector-level bundles differ based on differences in references to memory arrays of the bit-level netlist by respective registers of the vector-level bundles.

8. The system of claim 7, wherein the vectorization module is operable to:
group all registers of the bit-level netlist into a first vector-level bundle; and
iteratively break the first vector-level bundle into successively smaller vector-level bundles based on uniformity of references to the memory arrays of the respective registers.

9. The system of claim 7, wherein the bit-level netlist defines a plurality of multiplexors, and wherein the vectorization module is operable to bundle the multiplexors into a plurality of vector-level multiplexors based on common selectors.

10. The system of claim 7, wherein the vectorization module is operable to form a plurality of partially-interpreted function (pif) vectors from the bit-level netlist based on orthogonality of data propagation through the bit-level netlist.

11. The system of claim 7, wherein the vectorization module is operable to:
assign a tag to each read port of the memory arrays;
propagate a read operation through the bit-level netlist;
analyze read references to the tags; and
differentiate the registers into the respective vector-level bundles based on a sensitivity of the respective registers to the read operation.

12. The system of claim 10, wherein the vectorization module is operable to identify logic of the bit-level netlist not representable as having orthogonal inputs.

13. A computer program product for bit-level netlist vectorization, the computer program product comprising:
a computer readable storage medium having computer readable program code embodied therewith, the computer readable program code comprising computer readable program code configured to:
receive a bit-level netlist defining a plurality of registers;
analyze propagation of read data associated with the registers through logic of the bit-level netlist; and
form a plurality of vector-level bundles of registers based on the propagation of read data through the logic, wherein the plurality of vector-level bundles differ based on differences in references to memory arrays of the bit-level netlist by respective registers of the vector-level bundles.

14. The computer program product of claim 13, wherein the computer readable program code is configured to:
group all registers of the bit-level netlist into a first vector-level bundle; and
iteratively break the first vector-level bundle into successively smaller vector-level bundles based on uniformity of references to the memory arrays of the respective registers.

15. The computer program product of claim 13, wherein the computer readable program code is configured to bundle multiplexors of the bit-level netlist into a plurality of vector-level multiplexors based on common selectors.

16. The computer program product of claim 13, wherein the computer readable program code is configured to form a plurality of partially-interpreted function (pif) vectors from the bit-level netlist based on orthogonality of data propagation through the bit-level netlist.

17. The computer program product of claim 13, wherein the computer readable program code is configured to:
assign a tag to each read port of the memory arrays;
propagate a read operation through the bit-level netlist;
analyze read references to the tags; and
differentiate the registers into the respective vector-level bundles based on a sensitivity of the respective registers to the read operation.

18. The computer program product of claim 16, wherein the computer readable program code is configured to identify logic of the bit-level netlist not representable as having orthogonal inputs.

19. A method, comprising:
selecting memory array read ports of a bit-level netlist;
associating data pins of the memory array read ports with a tag;
propagating data through the bit-level netlist;
computing a set of tags for registers of the bit-level netlist based on a next-state function of the data pins of the memory array read ports; and
bundling registers of the bit-level netlist into vector-level groups based on uniform sets of the computed tags.

20. The method of claim 19, further comprising bundling multiplexors of the bit-level netlist into a plurality of vector-level multiplexors based on common selectors.

21. The method of claim 19, further comprising forming a plurality partially-interpreted function (pif) vectors from the bit-level netlist based on orthogonality of data propagation through the bit-level netlist.

22. The method of claim 21, further comprising identifying logic of the bit-level netlist not representable as having orthogonal inputs.

* * * * *